(12) United States Patent
Wirth et al.

(10) Patent No.: US 8,851,218 B2
(45) Date of Patent: Oct. 7, 2014

(54) METHOD FOR DETERMINING A POWER LIMITING VALUE FOR AN ELECTRIC MACHINE IN A VEHICLE, COMPUTER PROGRAM AND CONTROL UNIT FOR CONTROLLING AN ELECTRIC MACHINE IN A VEHICLE

(75) Inventors: Martin Wirth, Paris (FR); Daniel Raichle, Vaihingen (DE); Alexander Scheidle, Karlsruhe (DE); Martin Eisenhardt, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 185 days.

(21) Appl. No.: 13/639,425

(22) PCT Filed: Feb. 25, 2011

(86) PCT No.: PCT/EP2011/052807
§ 371 (c)(1),
(2), (4) Date: Dec. 17, 2012

(87) PCT Pub. No.: WO2011/124416
PCT Pub. Date: Oct. 13, 2011

(65) Prior Publication Data
US 2013/0085635 A1   Apr. 4, 2013

(30) Foreign Application Priority Data
Apr. 8, 2010 (DE) .................. 10 2010 003 758

(51) Int. Cl.
*B60W 10/04*  (2006.01)
*B60L 15/20*  (2006.01)
*B60L 11/18*  (2006.01)
*H02J 7/00*  (2006.01)
*B60W 10/26*  (2006.01)
*B60W 20/00*  (2006.01)
*B60W 10/08*  (2006.01)
*G01R 31/36*  (2006.01)

(52) U.S. Cl.
CPC ......... *B60L 11/18* (2013.01); *H02J 2007/0037* (2013.01); *H02J 7/0073* (2013.01); *B60W 2510/242* (2013.01); *B60W 2710/086* (2013.01); *B60W 10/26* (2013.01); *B60W 20/106* (2013.01); *B60W 10/08* (2013.01); *B60L 15/20* (2013.01); *B60L 11/1851* (2013.01); *B60L 11/1803* (2013.01); *Y02T 10/7005* (2013.01); *Y02T 10/705* (2013.01); *Y02T 10/70* (2013.01); *G01R 31/3693* (2013.01); *Y10S 903/906* (2013.01); *Y10S 903/907* (2013.01)
USPC .................. 180/65.285; 180/65.29; 180/65.1; 701/22; 903/906; 903/907

(58) Field of Classification Search
None
See application file for complete search history.

(56) References Cited

U.S. PATENT DOCUMENTS 6,331,762 B1    12/2001    Bertness
2010/0076647 A1    3/2010   Kamichi et al.

FOREIGN PATENT DOCUMENTS

EP    1 642 764    4/2006

OTHER PUBLICATIONS

International Search Report for PCT/EP2011/052807, dated Feb. 13, 2012.

*Primary Examiner* — Thomas Tarcza
*Assistant Examiner* — Richard Goldman
(74) *Attorney, Agent, or Firm* — Kenyon & Kenyon LLP

(57) ABSTRACT

In a method for determining a power limiting value for an electric machine in a vehicle, the electric machine being assigned an energy storage device, an intermediate power value is calculated from a maximally allowable current of the energy storage device and an instantaneous voltage. A corrected intermediate power value is determined by adding at least one power loss to the intermediate power value. A first correction value is determined for reducing the absolute value of the corrected intermediate power value if an instantaneous power of the energy storage device is greater than the absolute value of the calculated intermediate power value. The power limiting value is determined by superimposing the first correction value on the corrected intermediate power value.

7 Claims, 3 Drawing Sheets

METHOD FOR DETERMINING A POWER LIMITING VALUE FOR AN ELECTRIC MACHINE IN A VEHICLE, COMPUTER PROGRAM AND CONTROL UNIT FOR CONTROLLING AN ELECTRIC MACHINE IN A VEHICLE

BACKGROUND OF THE INVENTION

1. Field of the Invention

The present invention relates to a method for determining a power limiting value for an electric machine in a vehicle, in particular in an electric or hybrid vehicle, a computer program, and a control unit for controlling an electric machine in a vehicle.

2. Description of the Related Art

Electric machines are used, for example, in hybrid vehicles, where they are operated either in motor mode or in generator mode. In the motor mode, the electric machine is supplied with power from an energy storage device such as a battery, and generates an additional drive torque, which supports an internal combustion engine, for example, in an acceleration phase. In the generator mode, the electric machine generates electric power, which is stored in the energy storage device. The operating mode and power of the electric machine are set with the aid of an inverter.

In order to make the best possible use of the power capability of the electric machine on the one hand and to prevent damage to the energy storage device on the other hand, a power limiting value must be observed in both the motor mode and the generator mode of the electric machine; when this power limiting value is reached, the inverter reduces the power of the electric machine, and this power limiting value is essentially determined by a maximally allowable battery power. The maximally possible battery power in each case may be specified, for example, via a maximally allowable current at a predefined voltage. However, in order to precisely determine the maximally possible battery power, the efficiency of the energy storage device must be taken into account. This efficiency, however, is influenced by many factors such as operating point, temperatures, etc., and is therefore difficult to determine mathematically with sufficient accuracy. If this accuracy is not achieved, a power limit set excessively low causes the power capability of the electric machine not to be fully utilized. Conversely, a power limit set excessively high may permanently damage the energy storage device.

BRIEF SUMMARY OF THE INVENTION

The method according to the present invention for determining a power limiting value for an electric machine in a vehicle, in particular in an electric or hybrid vehicle, the electric machine being assigned an energy storage device, from which the electric machine may be supplied with power in a motor mode and in which energy may be stored in a generator mode of the electric machine, provides for determining the power limiting value with the aid of a controller having pilot control. An intermediate power value is calculated from a maximally allowable current of the energy storage device and an instantaneous voltage. A corrected intermediate power value is determined by a pilot control unit by adding at least one power loss to the calculated intermediate power value. A first correction value is determined by a control unit, which is preferably designed as a proportional-integral controller (PI controller), for reducing the absolute value of the corrected intermediate power value if the absolute value of an instantaneous power of the energy storage device is greater than the calculated intermediate power value. Finally, the power limiting value is determined by superimposing the first correction value on the corrected intermediate power value additively or multiplicatively.

Determining the power limiting value with the aid of a controller having pilot control, taking into account the power loss offers the advantage that the power limiting value may be determined with sufficient accuracy without precisely ascertaining the efficiency and thus with little hardware and software complexity, so that the power capability of the electric machine may be better utilized at any operating point, either in the generator mode or in the motor mode, without running the risk of damaging the energy storage device.

According to one specific embodiment of the present invention, the power loss is determined as a function of the intermediate power value and an instantaneous rotational speed of the electric machine, preferably read automatically from an appropriate characteristics map.

However, since this type of determination of the power loss is often subject to error and thus results in inaccuracies, according to another specific embodiment of the present invention it is provided that the corrected intermediate power value is determined by superimposing, additively or multiplicatively, a second correction value on the sum of the power loss and calculated intermediate power value. This ensures an increase in the calculated value beyond the predefined power limiting value of the energy storage device, which is specified by the maximally allowable current at a predefined voltage. This increase is then compensated for by the PI controller, whereby ultimately the exact efficiency is taken into account. Optimum utilization of the power capability of the energy storage device is also ensured in this way.

This second correction value may be formed using a predefined first power correction value or using a second power correction factor determined from a predefined torque value by multiplying it by an instantaneous angular velocity, the greater of the two power correction values being advantageously used.

The present invention also relates to a computer program having program instructions for carrying out the method according to the present invention.

Furthermore, the present invention also relates to a control unit for controlling an electric machine in a vehicle, in particular in an electric or hybrid vehicle, the electric machine being assigned an energy storage device, from which the electric machine may be supplied with power in a motor mode and in which energy may be stored in a generator mode of the electric machine. The control unit includes a memory in which a computer program of the above type is stored.

DETAILED DESCRIPTION OF THE INVENTION

Figure 1:
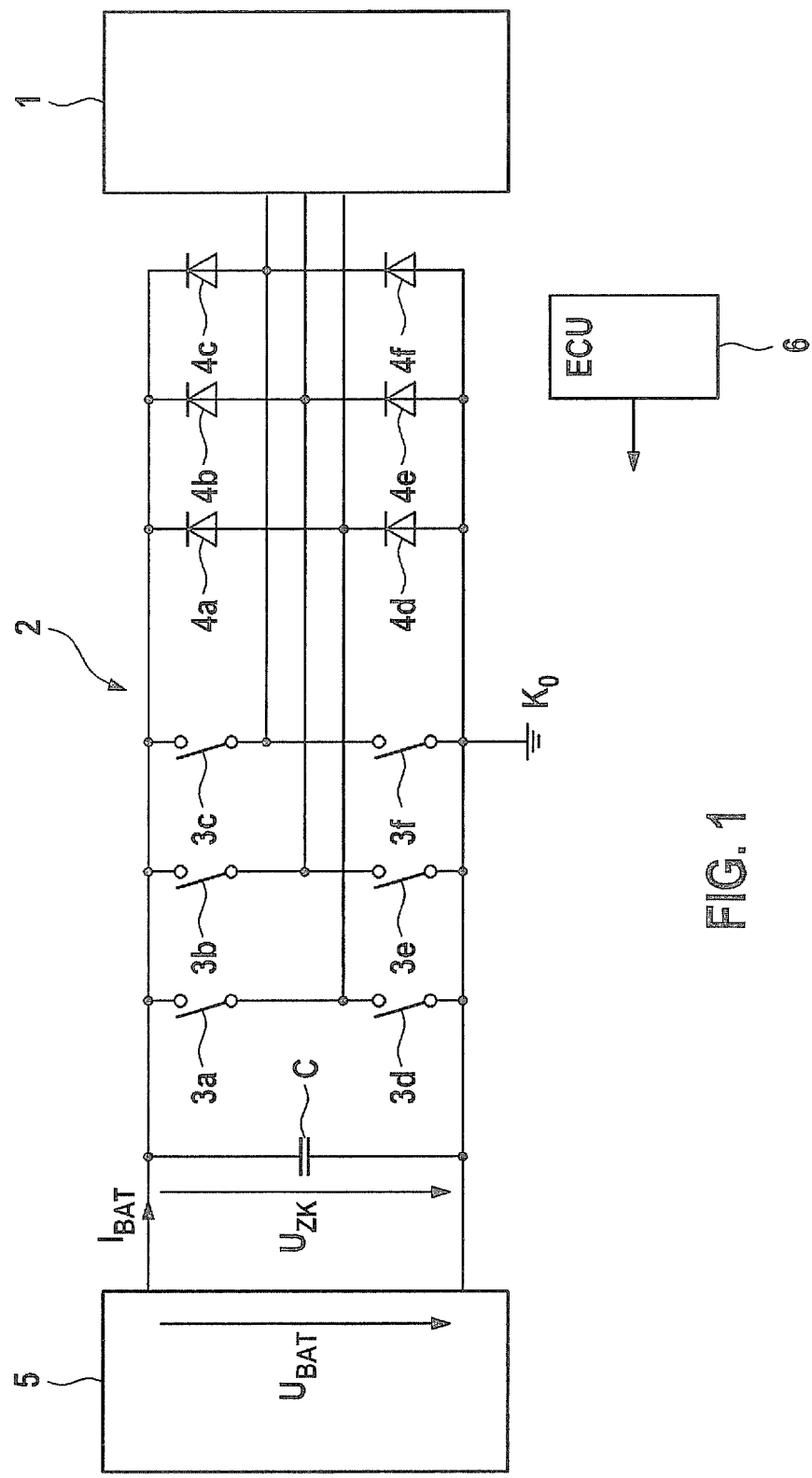
FIG. 1 shows a schematic illustration of a three-phase electric machine controlled by an inverter.

FIG. 1 shows a schematic illustration of an electric machine 1 having an inverter in the form of a pulse-controlled inverter 2 connected thereto. Pulse-controlled inverter 2 includes multiple power components—often also referred to as power semiconductors—in the form of power switching elements 3a through 3f, which are connected to individual phases U, V, W of electric machine 1 and connect phases U, V, W either to a high supply potential (battery voltage $U_{Bat+}$) or a low supply potential ($U_{Bat-}$). Power switching elements 3a through 3c connected to high supply potential $U_{Bat+}$ are also referred to as "high-side switches," and power switching elements 3d through 3f connected to low supply potential $U_{bat-}$ are referred to as "low-side switches." Pulse-controlled inverter 2 also includes other power components in the form of freewheeling diodes 4a through 4f, which in the illustrated exemplary embodiment are situated in the form of a six-pulse rectifier bridge circuit. Each diode 4a through 4f is connected in parallel to one of the power switching elements 3a through 3f. The power switching elements may be designed as IGBTs (Insulated Gate Bipolar Transistors) or as MOSFETs (Metal Oxide Semiconductor Field-effect Transistors).

Pulse-controlled inverter 2 determines the power and the mode of operation of electric machine 1 and is controlled accordingly by a control unit 6. Electric machine 1 may thus be operated either in the motor mode or in the generator mode. In the motor mode, it generates an additional drive torque, which supports the internal combustion engine, for example, in an acceleration phase. In contrast, in the generator mode, mechanical energy is converted into electrical energy and stored in an energy storage device, here in a battery 5. Battery 5 is connected to a power supply system (not illustrated) in a motor vehicle; battery 5 may be designed as a high-voltage battery and the power supply system may be designed as a high-voltage traction system, for example, in a hybrid vehicle. Control unit 6 also determines and monitors a power limiting value; when this power limiting value is reached, pulse-controlled inverter 2 reduces the power of electric machine 1, and this power limiting value is essentially determined by a maximally allowable battery power.

A so-called intermediate circuit capacitor C, which is essentially used for stabilizing battery voltage $U_{Bat}$ and to which an intermediate circuit voltage $U_{zk}$ is applied, is situated in parallel to pulse-controlled inverter 2.

Figure 2:
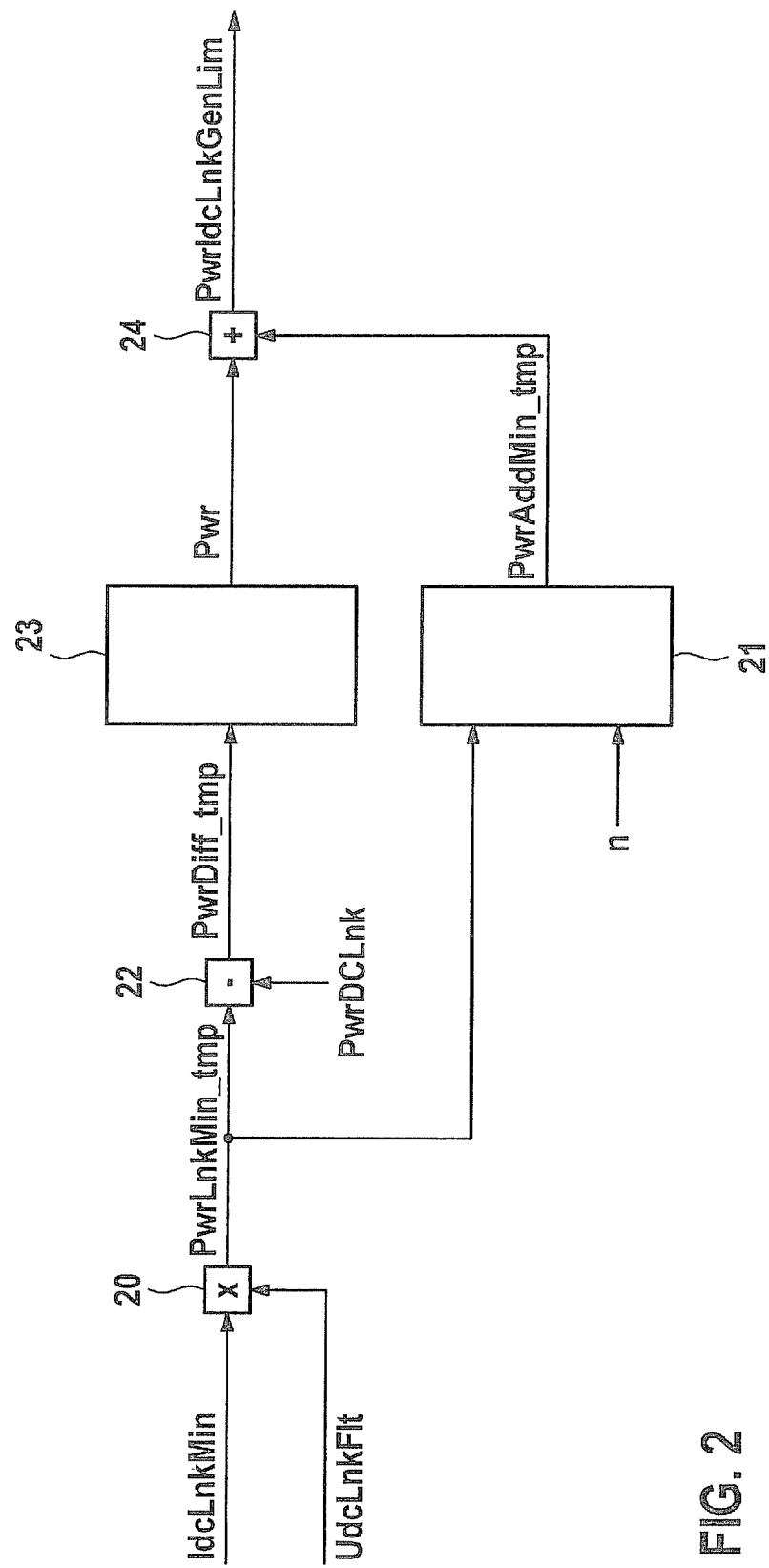
FIG. 2 shows a flow chart of the method according to the present invention for determining a power limiting value of an electric machine.

FIG. 2 schematically shows a flow chart of the method according to the present invention for determining a power limiting value for an electric machine 1. The illustrated blocks need not be concretely isolated from each other, but may also be implemented via software by different subprograms. The method according to the present invention is illustrated as an example for a generator mode of electric machine 1, but is similarly applicable to a motor mode.

An intermediate power value PwrLnkMin_tmp is calculated by multiplication (block 20) from a maximally allowable battery current IdcLnkMin and an instantaneous voltage UdcLnkFlt, which is determined by measurement. The abbreviation "Min" indicates a negative maximum battery current, and in this respect it affects the generator mode of the electric machine. This intermediate power value PwrLnkMin_tmp is, on the one hand, supplied to a pilot control unit 21. On the other hand, a difference is formed between intermediate power value PwrLnkMin_tmp and an instantaneous power PwrDCLnk determined by measurement (block 22), and the resulting power difference PwrDiff_tmp is supplied to a control unit 23, which is advantageously designed as a PI controller.

Figure 3:
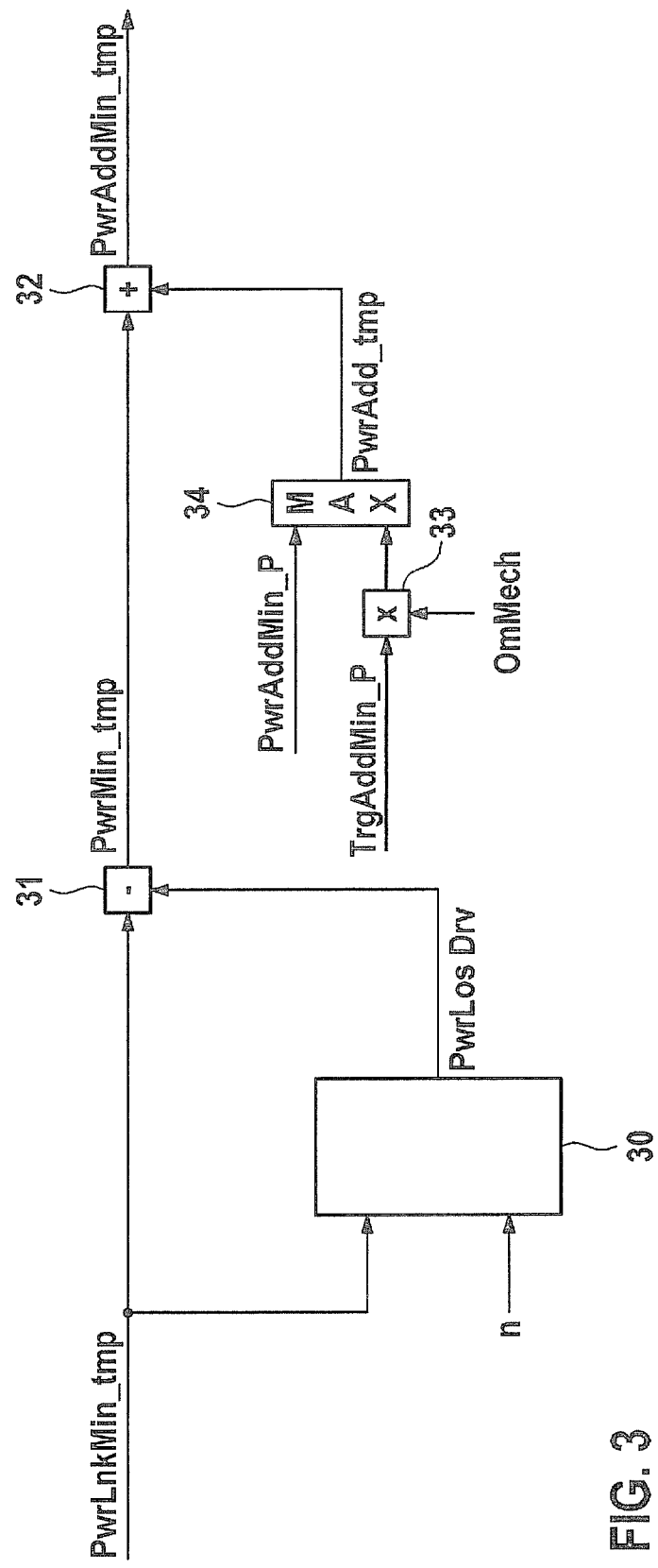
FIG. 3 shows a flow chart for elucidating the mode of operation of a pilot control unit according to FIG. 2.

Pilot control unit 21 determines a corrected intermediate power value PwrAdd_tmp by adding at least one power loss PwrLosDrv to calculated intermediate power value PwrLnkMin_tmp, which is elucidated in greater detail below with reference to FIG. 3. In addition, an instantaneous rotational speed n of electric machine 1, determined by measurement, is supplied to pilot control unit 21. Control unit 23 is designed and programmed in such a way that a first correction value Pwr is determined for reducing the absolute value of corrected intermediate power value PwrAdd_tmp if the absolute value of instantaneous power PwrDCLnk of the energy storage device is greater than intermediate power value PwrLnkMin_tmp.

Subsequently, power limiting value PwrldcLnkGenLim is determined by additively superimposing first correction value Pwr on corrected intermediate power value PwrAdd_tmp (block 24). Alternatively, a multiplicative superimposing via appropriate adaptation of the correction value is also conceivable. In other words, control unit 23 causes the power limiting value to decrease in the case where the absolute value of the instantaneous power is greater than the calculated intermediate power value.

The mode of operation of pilot control unit 21 is elucidated below with reference to the schematically illustrated flow chart of FIG. 3. As a function of the two input quantities of pilot control unit 21, namely of intermediate power value PwrLnkMin_tmp calculated from the maximally allowable battery current IdcLnkMin and the instantaneous voltage UdcLnkFlt, and instantaneous rotational speed n of electric machine 1, power loss PwrLosDrv is determined or automatically read in a block 30, which is advantageously designed as a characteristics map. The absolute value of this power loss PwrLosDrv is added to calculated intermediate power value PwrLnkMin_tmp in a block 31, whereby a temporarily calculated intermediate power value PwrMin_tmp results. For the generator mode illustrated as an example, having negative power value, block 31 is designed as a place of subtraction.

Since the determination of power loss PwrLosDrv is often subject to error and thus results in inaccuracies, it may be provided to superimpose a second correction value PwrAdd_tmp additively or multiplicatively on the temporarily corrected intermediate power value PwrMin_tmp (block 32). In this way, an increase in the calculated value beyond the predefined power limiting value of the energy storage device, which is characterized by maximally allowable current IdcLnkMin, is achieved. This increase is then compensated for by control unit 23, whereby ultimately the exact efficiency is taken into account. This second correction factor may, in the simplest case, be formed by a predefined first power correction value PwrAddMin_P. However, no correction can thereby be ensured over the entire rotational speed range. For this reason, a second power correction value may be calculated from a predefined torque value TrqAddMin_P via multiplication (block 33) by an instantaneous angular velocity OmMech. If the greater of the two power correction values is used (block 34) as second correction value PwrAdd_tmp, it is ensured that the power limiting value may be determined with sufficient accuracy over the entire operating range of electric machine 1, so that, on the one hand, the power capability of the electric machine is optimally utilized and, on the other hand, damage to battery 5 is reliably avoided.

What is claimed is:

1. A method for controlling an electric machine in a vehicle, wherein the electric machine is assigned an energy storage device, and wherein the electric machine is supplied with power from the energy storage device in a motor mode and energy is stored in the energy storage device in a generator mode of the electric machine, the method comprising:
  determining a power limiting value for the electric machine, wherein the determining of the power limiting value includes:

calculating an intermediate power value from a maximally allowable current of the energy storage device and an instantaneous voltage;

determining a corrected intermediate power value by a pilot control unit in the vehicle by adding at least one power loss value to the calculated intermediate power value;

determining a first correction value by a second control unit in the vehicle for reducing the absolute value of the corrected intermediate power value if the absolute value of an instantaneous power of the energy storage device is greater than the calculated intermediate power value; and determining the power limiting value by superimposing, one of additively or multiplicatively, the first correction value on the corrected intermediate power value.

2. The method as recited in claim 1, wherein the second control unit is a proportional-integral controller.

3. The method as recited in claim 2, wherein the power loss value is determined as a function of the calculated intermediate power value and an instantaneous rotational speed of the electric machine.

4. The method as recited in claim 2, wherein the power loss value is read from a characteristics map.

5. The method as recited in claim 2, wherein the corrected intermediate power value is determined by superimposing, one of additively or multiplicatively, a second correction value, which compensates for inaccuracies when determining the power loss, on the sum of the power loss value and the calculated intermediate power value.

6. A non-transitory computer-readable data storage medium storing a computer program having program codes which, when executed on a computer, performs a method for controlling an electric machine in a vehicle, wherein the electric machine is assigned an energy storage device, and wherein the electric machine is supplied with power from the energy storage device in a motor mode and energy is stored in the energy storage device in a generator mode of the electric machine, the method comprising:

determining a power limiting value for the electric machine, wherein the determining of the power limiting value includes:

calculating an intermediate power value from a maximally allowable current of the energy storage device and an instantaneous voltage;

determining a corrected intermediate power value by a pilot control unit in the vehicle by adding at least one power loss value to the calculated intermediate power value;

determining a first correction value by a second control unit in the vehicle for reducing the absolute value of the corrected intermediate power value if the absolute value of an instantaneous power of the energy storage device is greater than the calculated intermediate power value; and determining the power limiting value by superimposing, one of additively or multiplicatively, the first correction value on the corrected intermediate power value.

7. A controller in a vehicle for controlling an electric machine in the vehicle, wherein the electric machine is assigned an energy storage device, and wherein the electric machine is supplied with power from the energy storage device in a motor mode and energy is stored in the energy storage device in a generator mode of the electric machine, the method comprising:

determining a power limiting value for the electric machine, wherein the determining of the power limiting value includes:

calculating an intermediate power value from a maximally allowable current of the energy storage device and an instantaneous voltage;

determining a corrected intermediate power value by a pilot control unit in the vehicle by adding at least one power loss value to the calculated intermediate power value;

determining a first correction value by a second control unit in the vehicle for reducing the absolute value of the corrected intermediate power value if the absolute value of an instantaneous power of the energy storage device is greater than the calculated intermediate power value; and determining the power limiting value by superimposing, one of additively or multiplicatively, the first correction value on the corrected intermediate power value.

* * * * *